United States Patent [19]

Hoeberechts et al.

[11] Patent Number: 5,057,458
[45] Date of Patent: Oct. 15, 1991

[54] COMBINATION OF A SUPPORT AND A SEMICONDUCTOR BODY AND METHOD OF MANUFACTURING SUCH A COMBINATION

[75] Inventors: Arthur M. E. Hoeberechts; Petrus J. M. Peters, both of Eindhoven, Netherlands

[73] Assignee: U.S. Philips Corporation, New York, N.Y.

[21] Appl. No.: 468,679

[22] Filed: Jan. 23, 1990

Related U.S. Application Data

[62] Division of Ser. No. 334,063, Apr. 4, 1989, Pat. No. 4,929,999.

[30] Foreign Application Priority Data

Apr. 8, 1988 [NL] Netherlands .................. 8800901

[51] Int. Cl.$^5$ ........................................... H01L 23/48
[52] U.S. Cl. .................... 437/209; 437/222; 29/838; 29/845; 228/136
[58] Field of Search ............... 357/68, 26; 437/222, 437/209; 29/831, 832, 837, 838, 839, 844, 845; 228/136

[56] References Cited

U.S. PATENT DOCUMENTS

| | | | |
|---|---|---|---|
| 3,363,308 | 1/1968 | Lueck | 29/589 |
| 4,024,627 | 5/1977 | Stauffer | 437/906 |
| 4,185,378 | 1/1980 | Machida | 29/839 |
| 4,753,601 | 6/1988 | Cobaugh et al. | 29/837 |
| 4,754,316 | 6/1988 | Reid | 357/68 |
| 4,970,624 | 11/1990 | Arneson et al. | 29/845 |

*Primary Examiner*—Olik Chaudhuri
*Assistant Examiner*—Andrew Griffin
*Attorney, Agent, or Firm*—Norman N. Spain

[57] ABSTRACT

The invention relates to the combination of a support and a semiconductor body and to a method of manufacturing same, in which a deformable metal layer is disposed between the semiconductor body and the support.

The semiconductor body is connected to the support by pressing the semiconductor body and the support against each other under pressure after heating the metal layer. The semiconductor body is then provided at its surface facing the support with at least one projecting part, which is embedded in the metal layer.

3 Claims, 1 Drawing Sheet

COMBINATION OF A SUPPORT AND A SEMICONDUCTOR BODY AND METHOD OF MANUFACTURING SUCH A COMBINATION

This is a division of application Ser. No. 334,063, filed Apr. 4, 1989, now U.S. Pat. No. 4,929,999.

BACKGROUND OF THE INVENTION

The invention relates to a combination of a support and a semiconductor body, in which a deformable metal layer is disposed between the semiconductor body and the support and the semiconductor body is connected to the support by pressing the semiconductor body and the support against each other under pressure after heating the metal layer.

Such a combination of a semiconductor body and a support is known from Netherlands Patent Application 7415668. In this known combination, the metal layer is enclosed between two parallel extending boundary surfaces of the support and the semiconductor body.

In general, such a connection is satisfactory, but in certain cases it may be desirable to realize a more rigid connection between the support and the semiconductor body.

SUMMARY OF THE INVENTION

According to the invention, this can be achieved in that the semiconductor body is provided at its surface facing the support with at least one projecting part, which is embedded in the metal layer.

In practice it has been found that by the use of one or several projecting parts engaging into the metal layer provided between the support and the semiconductor a considerable improvement of the adhesion between the semiconductor body and the support is obtained.

If the projection then has a closed contour, by means of this projection a particularly satisfactory vacuum-tight connection can further be obtained between the semiconductor body and the support, which may be important, for example, in pressure sensors and the like.

A further aspect of the invention relates to a method of connecting a semiconductor body to a support, in which a deformable metal layer is provided between the semiconductor body and the support and the semiconductor body is connected to the support by pressing the semiconductor body and the support against each other under pressure at an elevated temperature.

According to the invention, before the semiconductor body is provided on the support, a projecting part integral with the semiconductor body is formed on the semiconductor body on the side to face the support and this projecting part is pressed into the metal layer when providing the semiconductor.

By the use of the method according to the invention, a semiconductor body to be manufactured in a simple manner can be secured very firmly to a support.

BRIEF DESCRIPTION OF THE INVENTION

In the drawing, FIG. 1 is a cross-sectional view of a semiconductor body, provided with projecting parts, a support and an interposed metal layer according to the invention and FIG. 2 is an elevation of the semiconductor body of FIG. 1 taken along the arrow 11 in FIG. 1.

DETAILED DESCRIPTION OF THE INVENTION

The invention will now be described more fully with reference to an embodiment of the combination according to the invention shown in the accompanying Figures.

Figure 1:
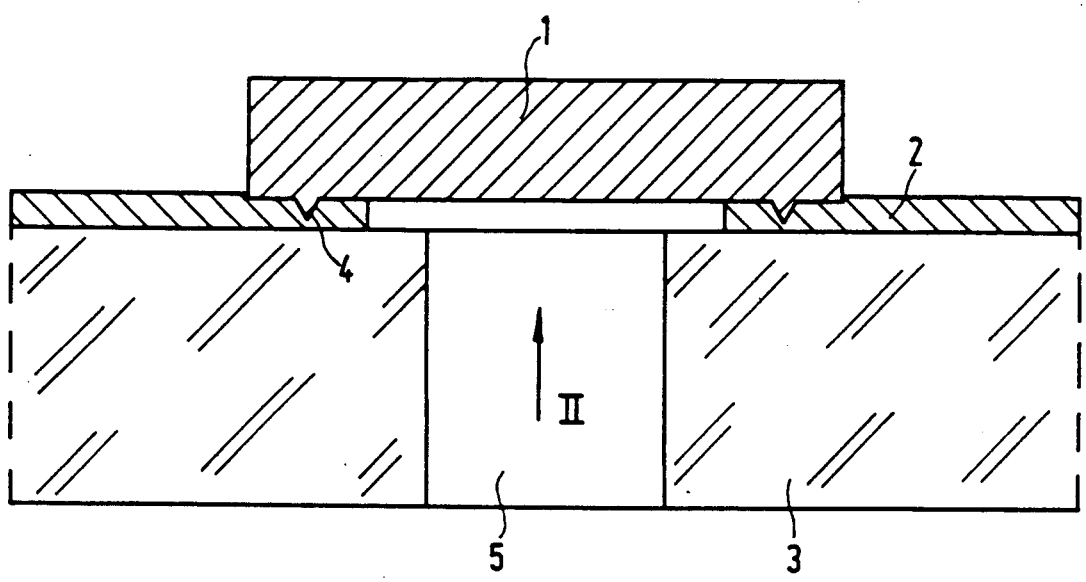

As shown diagrammatically in FIG. 1, a semiconductor body 1 is provided on a support 3 with the interposition of a metal layer 2.

The insulating support 3 may be made, for example, of glass.

Preferably, the metal layer 2 will consist of aluminium and will generally have a thickness of the order of 10 $\mu$m.

Figure 2:
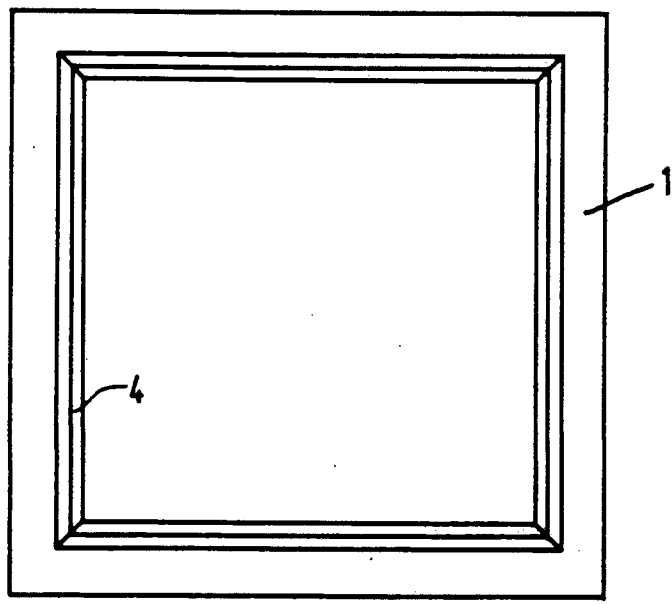

As will further appear from FIGS. 1 and 2, the semiconductor body 1 is provided on its side facing the support 3 with a projection, which is constituted in the embodiment shown by a continuous projecting edge 4 having a cross-section of triangular form. The height of this projection projecting beyond the boundary surface of the semiconductor body is about half the thickness of the metal layer 2 in the non-deformed state.

The projection 4 can be formed in a simple and efficacious manner by removing parts of the starting material located around the projection by etching.

Before the connection between the support 3 and the semiconductor body 1 is established, the metal layer 2 is arranged between the support and the semiconductor body 1, after which, while heating the metal layer 2, the semiconductor body 1 and the support 3 are pressed towards each other, the continuous projection 4 penetrating in the manner shown in FIG. 1 into the metal layer. The metal layer 2 may be applied to the support 3, for example by vapour deposition.

It has been found that the adhesion between the semiconductor body and the metal layer is considerably more satisfactory than in the embodiment in which the boundary surface of the semiconductor body facing the support 3 is flat.

As a matter of course, variations of and or additions to the embodiment of the construction according to the invention described above are conceivable within the scope of the invention.

For example, it is not necessary for the projection 4 to have a closed contour, while it is also possible that several projections located at a certain relative distance are provided. A projection having a closed contour is particularly advantageous, however, if the projection, as is the case in the embodiment shown in FIG. 2, surrounds a recess 5 provided in the support 3 and different pressures prevail on either side of the support. In fact it has been found that by the use of a projection having a closed contour a particularly satisfactory gas-tight connection can be obtained between the support and the semiconductor body.

The form of the cross-section of the projection 4 may also be different from the triangular form shown; for example, viewed in cross-section the projection may have the form of a truncated cone.

Another possibility consists in that, before the semiconductor body is arranged on the support, the projection is provided with an aluminum coating so that, when the semiconductor body is contacted with the metal layer consisting of aluminum, a connection of aluminium on aluminum is obtained. The projection may then also be provided with a silicon oxide layer, on which the aluminum coating is formed.

We claim:

1. A method of connecting a semiconductor body to a support, said method comprising forming at least one projecting part, projecting from the surface of the semiconductor body to face the support, providing a deformable metal layer between the surface of the semiconductor body provided with the projection and the support and then pressing the support and the semiconductor body under pressure at an elevated temperature in a manner such that the projecting part is pressed into the metal layer.

2. A method of connecting a semiconductor body to a support, said method comprising forming, by etching, at least one projecting part, projecting from the surface of the semiconductor body to face the support, providing a deformable metal layer between the surface of the semiconductor body provided with the projection and the support and then pressing the support and the semiconductor body under pressure at an elevated temperature in a manner such that the projecting part is pressed into the metal layer.

3. A method of connecting a semiconductor body to a support, said method comprising forming at least one projecting part, projecting from the surface of the semiconductor body to face the support, coating said projecting part with aluminum, providing a deformable metal layer between the surface of the semiconductor body provided with the projection and the support and then pressing the support and the semiconductor body under pressure at an elevated temperature in a manner such that the projecting part is pressed into the metal layer.

* * * * *